United States Patent [19]

Moxley et al.

[11] Patent Number: 5,467,456
[45] Date of Patent: Nov. 14, 1995

[54] HIGH SPEED BUS BRANCHES WITH COMPACT PHYSICAL SPACING

[75] Inventors: David C. Moxley, Irmo; Frank W. Cabaniss, Columbia, both of S.C.

[73] Assignee: NCR Corporation, Dayton, Ohio

[21] Appl. No.: 311,292

[22] Filed: Sep. 23, 1994

Related U.S. Application Data

[63] Continuation of Ser. No. 899,193, Jun. 16, 1992, abandoned.

[51] Int. Cl.⁶ .............................. G06F 13/00; G06F 13/40
[52] U.S. Cl. ...................... 364/490; 364/239.9; 364/240; 364/DIG. 1; 395/309; 395/281
[58] Field of Search .......................... 395/325; 361/397; 364/488–490, 712; 333/4, 125

[56] References Cited

U.S. PATENT DOCUMENTS

| | | | |
|---|---|---|---|
| 2,832,935 | 4/1958 | Tank | 333/29 |
| 2,837,619 | 6/1958 | Stein | 201/63 |
| 3,309,585 | 3/1967 | Forrest | 317/234 |
| 4,160,210 | 7/1979 | Molinari | 455/217 |
| 4,672,685 | 6/1987 | Phillips et al. | 455/89 |
| 4,697,335 | 10/1987 | Pedersen et al. | 29/620 |
| 4,744,006 | 5/1988 | Duffield | 361/413 |
| 4,752,728 | 6/1988 | Nakamura et al. | 324/71.3 |
| 4,831,497 | 5/1989 | Webster et al. | 361/406 |
| 4,879,433 | 11/1989 | Gillett et al. | 174/32 |
| 4,934,045 | 6/1990 | Mase | 29/854 |
| 4,998,180 | 3/1991 | McAuliffe et al. | 361/383 |
| 5,012,389 | 4/1991 | Perry | 361/409 |
| 5,047,895 | 9/1991 | Sasaki | 361/398 |
| 5,099,137 | 3/1992 | Lattin, Jr. | 307/147 |
| 5,117,331 | 5/1992 | Gebara | 361/407 |
| 5,149,918 | 9/1992 | Kozik et al. | 178/18 |
| 5,175,515 | 12/1992 | Abernathy et al. | 333/4 |
| 5,296,814 | 3/1994 | Lyle | 324/322 |

*Primary Examiner*—Gopal C. Ray
*Attorney, Agent, or Firm*—Jack R. Penrod

[57] ABSTRACT

A physically compact peripheral bus that provides a long electrical distances between signal branch off points. The compact physical spacing allows a high speed peripheral bus to be used to connect a large number of peripheral devices within a computer system enclosure and yet avoiding the reflections experienced when numerous peripheral branch connections are located near to each other. Branch reflections are reduced by providing an electrically short branch length in conjunction with an electrically long printed wiring path for each signal, while maintaining a physically short connector spacing. The physically-short, electrically-long path is accomplished by a serpentine printed wiring conductor path of many folds for each high speed signal path between adjacent branches. Thus, the SCSI recommended spacing of 0.3 meters is provided in a physical spacing of 0.05 meters.

14 Claims, 2 Drawing Sheets

HIGH SPEED BUS BRANCHES WITH COMPACT PHYSICAL SPACING

This is a continuation of application Ser. No. 07/899,193, filed Jun. 16, 1992 now abondoned.

BACKGROUND OF THE INVENTION

The present invention relates to peripheral buses for computer systems, and more particularly to a peripheral bus apparatus for connecting a computer system to multiple peripheral units that may all be mounted within the same enclosure.

The Small Computer System Interface (SCSI) standard (ANSI X3.131-1986) and the follow-on Small Computer System Interface II (SCSI-2) proposed standard, ANSI X3.131-199X, revision 10h, define high speed peripheral buses for use in small computer systems. Both of these standards are hereby incorporated by reference. These standards set forth the attributes of SCSI and SCSI-2 high speed peripheral bus systems. One such attribute is the distance between branches branching off from a SCSI-2 bus or a SCSI bus. According to paragraph 4.2.1 of the SCSI-2 proposed standard referenced above, for single ended SCSI-2 bus or a SCSI bus the spacing between branches is recommended to be at least 0.3 meters. The reason behind this recommendation is that systems with closer branch spacings tend to have signal integrity problems, especially for signals having the faster rise times set forth in the SCSI-2 standard. These signal integrity problems stem primarily from reflections at the connection points where branches branch off from the main bus.

Once the signal integrity problem was recognized, one proposed solution was to physically increase the distance between branch connection points while also keeping the branch length physically short. Thus, the SCSI-2 standard has a 0.1 meter maximum branch length as well as the 0.3 meter minimum spacing between branch connection points.

One known way to implement the 0.3 meter branch spacing recommendation is to use a flexible cable that is 0.3 meters long for the SCSI or SCSI-2 bus, and coil the cable up in such a manner that its two ends may be attached to the 0.1 meter branches at the branch connection points. This allows two branch connectors to be located physically near one another, yet electrically separated by the recommended 0.3 meters of wire. The problem of this approach is that these coils of cable are bulky and their installation requires substantial manufacturing costs.

SUMMARY OF THE INVENTION

It is an object of the present invention to provide an electrical distance between two branches of a high speed bus in a compact form without the use of coiled-up cables.

It is another object of the present invention to provide a compact SCSI or SCSI-2 bus with the recommended 0.3 meter electrical distance between branches without a bulky coiled-up cable.

It is another object of the present invention to provide a circuit arrangement that provides the recommended 0.3 meter electrical distance between branches of a SCSI or SCSI-2 bus that is easy to manufacture and assemble.

Briefly stated, in accordance with one aspect of the invention the foregoing objects are achieved by providing a high speed peripheral bus for a computer system. The bus includes a printed wiring board that has a plurality of layers. On one of those layers is a printed wiring conductor. This printed wiring conductor is a signal line of the bus. A terminal of a first set of terminals forms a conduction path from one end of the printed wiring conductor to a signal of the bus of the computer system. A terminal of a second set of terminals connects to a second end of this printed wiring conductor. A terminal of a third set of terminals is located between the terminal of said first set of terminals and the terminal of said second set of terminals connecting to the printed wiring conductor at a branch connection. The path that the high speed bus signal travels from the terminal of the second set of terminals to the terminal of third set of terminals is sufficiently long for any reflections of the signal, caused by passing through the branch connection, are reduced below the level that induces false logic levels at any other terminal.

BRIEF DESCRIPTION OF THE DRAWINGS

While the specification concludes with the appended claims particularly pointing out and distinctly claiming the subject matter which is regarded as the invention, it is believed that the invention will be better understood from the following description taken in conjunction with the accompanying drawings in which:

DETAILED DESCRIPTION

Figure 1:
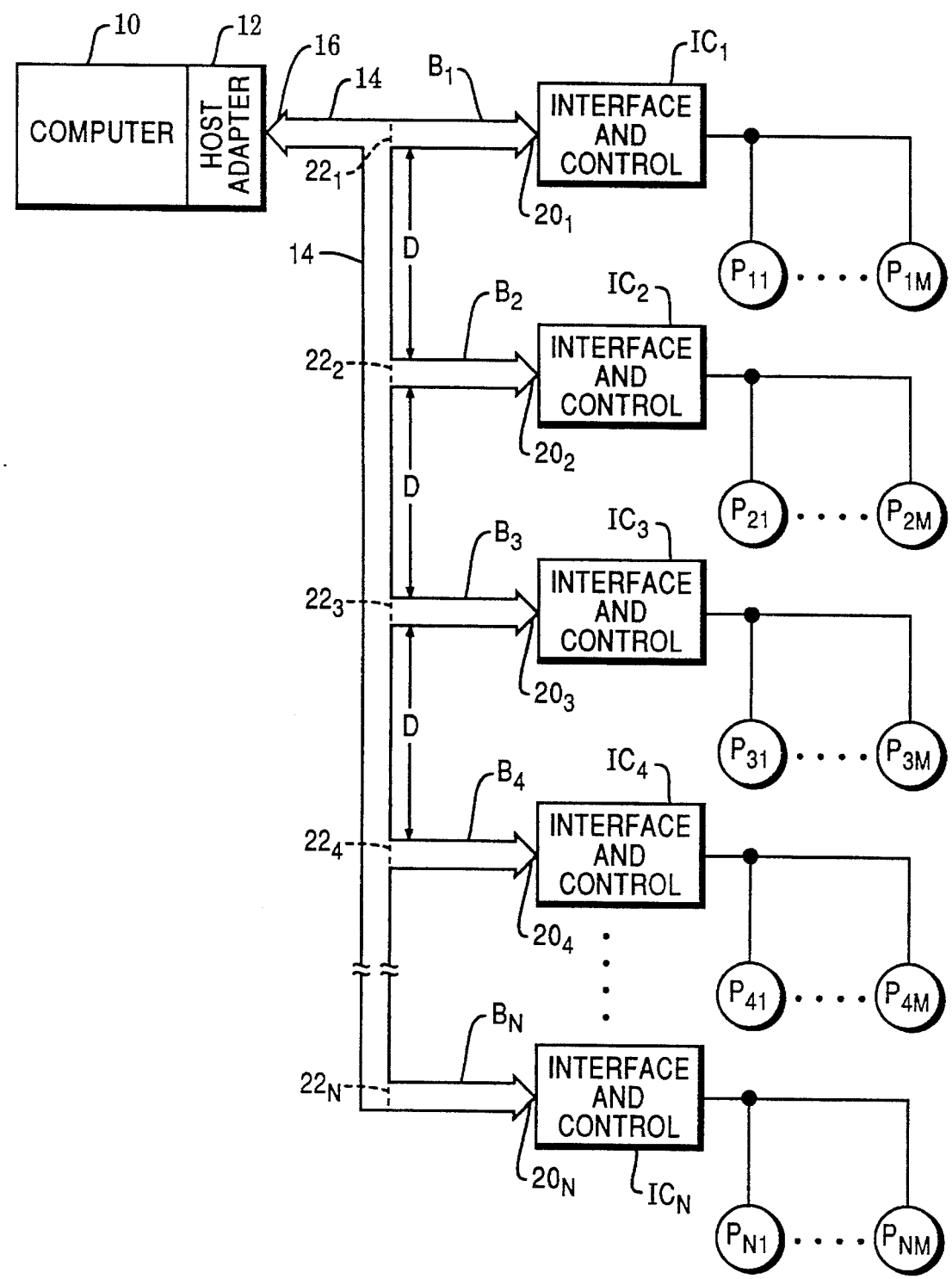
FIG. 1 is a block diagram of a computer system with a high speed bus connecting to numerous peripherals.

Referring now to FIG. 1, a computer system 10 is shown. Computer system 10 has a host adapter 12 which adapts data communications from a processor-memory bus protocol to a protocol of a high speed peripheral bus 14. In one embodiment of the present invention, high speed peripheral bus 14 is a SCSI bus, although with very minor modifications high speed peripheral bus 14 could also be a SCSI-2 bus, which is a superset of the SCSI bus and protocol, or some other high speed parallel peripheral bus. Host adapter 12 connects to one end of high speed peripheral bus 14 at interface point 16.

For a SCSI embodiment of the high speed peripheral bus 14, each high speed line operates at a data signaling rate of approximately 5 megabits/second. This means that each data signal period is about 200 nanoseconds. A SCSI bus has an eight bit wide data bus, which means that eight signals are transferred in parallel thereby. Thus, a SCSI embodiment of the invention has a data transfer rate of 5 megabytes per second over high speed peripheral bus 14. Also, some of the SCSI control signals switch at rates comparable to the data transfer rates and thus require similar circuitry.

High speed peripheral bus 14 has a number of branches $B_1$–$B_N$ connected to it. Each of these branches $B_1$–$B_N$ terminates with a respective connection $20_1$–$20_N$ to a respective Interface and Controller $IC_1$–$IC_N$. Each Interface and Controller $IC_1$–$IC_N$ is respectfully connected to a group of one or more peripheral devices $P_{11}$–$P_{1M}$ ... $P_{N1}$–$P_{NM}$. These peripheral devices may be any type of peripheral, such as a hard disk drive, a CD-ROM disk drive, a WORM disk drive, a floppy disk drive, a printer, etc.

As mentioned previously, each connection of one of the branches $B_1$–$B_N$ introduces a local discontinuity into the high speed peripheral bus 14, which in this case is an impedance discontinuity. The branches $B_1$–$B_N$ cause the impedance at their connection points to vary from the characteristic impedance of the high speed peripheral bus 14. The local discontinuities cause localized reflections as the high speed signals pass therethrough. Since these reflections can cause erroneous logic levels, which is a very undesirable situation, some type of arrangement to minimize reflections was necessary.

In a SCSI bus system, branch reflections may be managed by physically locating each branch connection $22_1$–$22_N$ a distance D from each other and physically limiting the length of branches $B_1$–$B_N$. In SCSI bus systems, especially those conforming to the newer SCSI-2 standard, the branch spacing D is recommended to be equal to or greater than 0.3 meters and the length of each branch $B_1$–$B_N$ is recommended to be equal to or less than 0.1 meters. By following these recommendations, signal integrity at each branch is maintained for both host adapter-to-interface controller and interface controller-to-host adapter data transfers. This is easy when the computer system 10 and the branches $B_1$–$B_N$ are in separate cabinets, the 0.3 meter spacing, approximately one foot, is very easy to implement. However, when the computer system 10 and the branches $B_1$–$B_N$ are in the same enclosure and the total number of branches is more than two or three, the 0.3 meter physical spacing can be a problem to implement in a reasonable sized enclosure.

Figure 2:
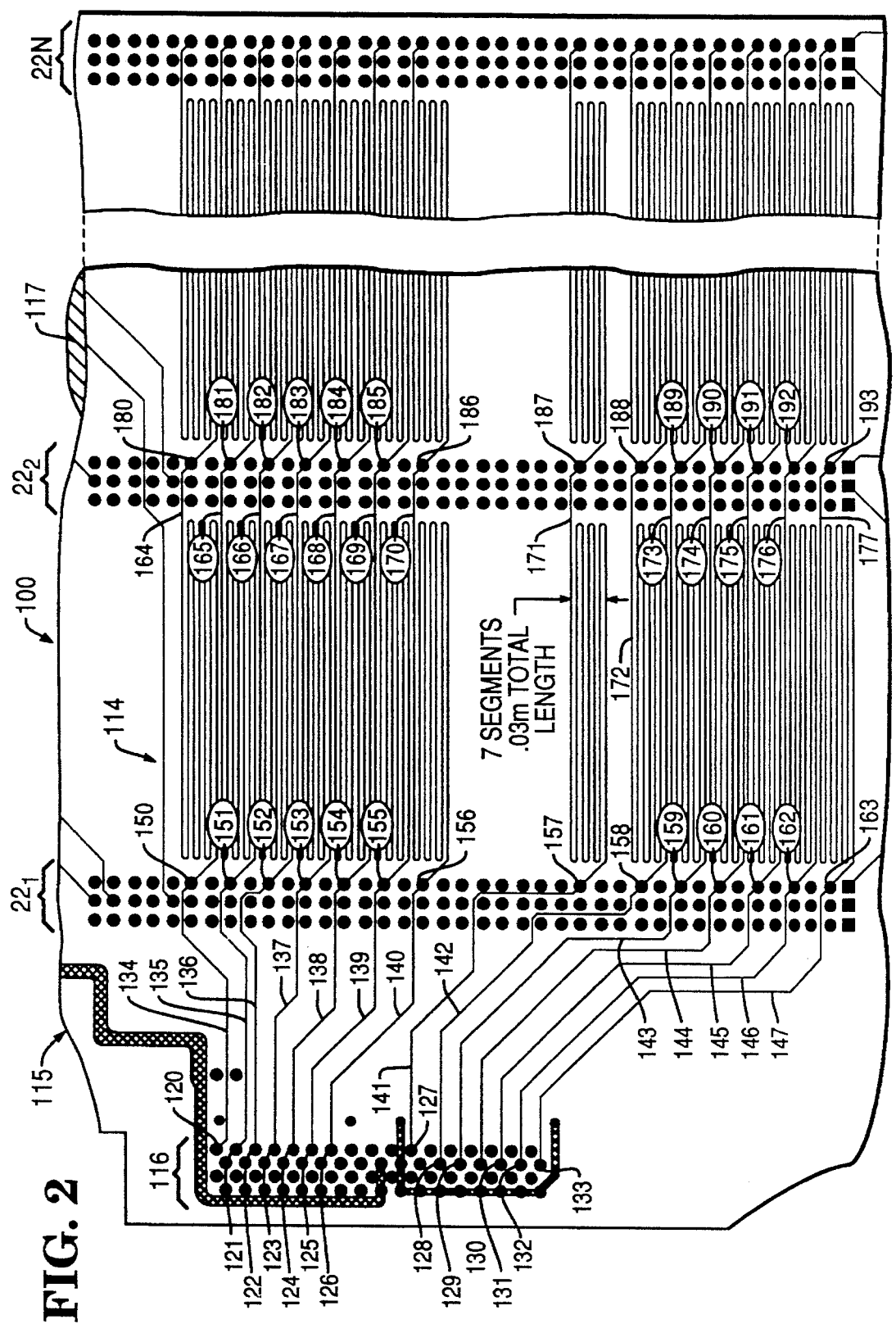
FIG. 2 is an elevational view that is partially broken away to show otherwise hidden attributes and to simplify the view.

Referring now to FIG. 2, a multiple layer printed wiring board (PWB) 100 is shown which provides a compact solution to the branch spacing problem according to the present invention. PWB 100 has a layer of printed wiring conductors of a compact high speed peripheral bus 114 mounted on an insulating layer 115. Below insulating layer 115 is a signal ground conductor 117, which may be one of the power supply conductors. In this embodiment of the invention, the conductors are etched copper and the insulating layer 115 is a rigid material, such as fiberglass-epoxy.

One embodiment of the invention has a second insulating layer after the ground conductor 117, a second signal ground conductor (not shown) on the second insulating layer, a third insulating layer (not shown) mounted on said second signal ground conductor, and a further printed wiring conductors of the compact peripheral bus 114 if needed. Since these parts of the PWBs are very similar to those shown in FIG. 2, and the PWB technology is well understood, the unshown layers of PWB 100 are omitted for simplicity.

PWB 100 has a plurality of terminals 116 for connection to the host adapter 12 (shown in FIG. 1). The connection between the host adapter 12 and the terminals 116 may be by direct wiring, or by a connector, such as those shown in the SCSI standards, that is mounted on the PWB 100 and connected to the terminals 116. Some of the terminals 116 are connected to data and control signals and others are connected to ground potentials.

Terminals 120–133 are connected to high speed data and control signals of the compact high speed peripheral bus 114 from the host adapter 12 (shown in FIG. 1). Each of the terminals 120–133 connects via lines 134–147 to respective terminals 150–163. Lines 134–147 transfer the high speed data and control signals from terminals 120–133 to terminals 150–163. Lines 134–147 are the high speed signal portion of the bus 114. Terminals 150–163 are the high speed signal connection points of the branch connection $22_1$. A second branch connection $22_2$ includes terminals 180–193 which are respectively connected to lines 164–177. Lines 164–177 are further extensions of lines 134–147, and thus a further high speed signal portion of the bus 114. The remaining branches $22_3$–$22_N$ and the high speed signal lines thereto are connected as incremental extensions of the bus 114 in the same manner that the second branch is connected, and thus these further lines and branches are represented in FIG. 2 in abbreviated form.

Terminals 120–133 may be used as direct connection points for a branch cable to a peripheral controller (such as $IC_1$ shown in FIG. 1), or they may be connection points to a connector for either a cable to a peripheral controller, or to receive another printed wiring board on which a peripheral controller is mounted. Terminals 180–193 of branch connection $22_2$ will typically be connected in the same way that terminals 150–163 are connected. Branch connections $22_3$–$22_N$ typically will be connected in the same manner as the terminals of branch connections $22_1$ and $22_2$.

In a SCSI embodiment, which is the preferred embodiment, terminals 150–163 of branch $22_1$ and terminals 180–193 of branch $22_2$ are each respectively arranged in a column. The column of terminals 150–163 is located between 1.75 and 2.00 inches from the next adjacent column of terminals 180–193. Each column of terminals of each branch connection $22_1$–$22_N$ is located in a parallel relationship to the next adjacent column of terminals.

Each of the lines 134–147 respectively connects one of the terminals 150–163 to one of the terminals 180–193 that is at most 2.00 inches or 0.05 meters away. This compact distance is substantially less than the 0.3 meter physical spacing recommend in the SCSI-2 proposed standard. To provide both the compact spacing needed to have many internal SCSI branches and also the 0.3 spacing, each of the lines 134–147 is at least 0.3 meters in length, but is folded in a serpentine shape in order to fit between the compact spacing of the columns of terminals. In the embodiment shown in FIG. 2, each line of lines 134–147 is folded seven times within its 0.05 meter spaced terminals in order to achieve a length of at least 0.3 meters.

For the SCSI peripheral bus embodiment, the bus 114 is required to maintain a characteristic impedance of at least 90 ohms at data and control signal frequencies. In this embodiment, the conductor width of each of the lines 134–147 is 0.0001524 meters. The serpentine folds in this embodiment have a 0.0004826 meter spacing between edges of adjacent serpentine of the same fold. This spacing achieved the desired characteristic impedance of at least 90 ohms between each line 134–147 and signal ground 117 at SCSI signal frequencies. This spacing was arrived at by considering the conductor dimensions and the dielectric characteristics of the PWB 100. Those skilled in the art will recognize that other combinations of dielectric spacing and conductor size are possible in order to achieve a characteristic impedance of at least 90 ohms, and such combinations are deemed to be minor variations of the scope of the present invention.

While the printed wiring connections between branch $22_1$ and adjacent branch $22_2$ has been particularly described, those skilled in the art will recognize from this description how the remaining branches $22_3$–$22_N$ can be compactly located on the PWB 100 and connected as part of the high speed peripheral bus 114, and thus will not be described further. The number of branches N depends thus on the physical branch spacing and the length of the PWB 100. If N is equal to or less than 7, then a compact SCSI bus can be realized. If more branches are needed, PWB 100 may be made longer and a compact SCSI-2 bus may be implemented. Also, if necessary, a similar set of additional lines or additional branches could be located on the back layer of PWB 100.

Thus, it will now be understood that there has been disclosed a physically compact high speed peripheral bus which includes has electrically long bus conductors in order to reduce reflections generated at bus branch off points. While the invention has been particularly illustrated and described with reference to preferred embodiments thereof, it will be understood by those skilled in the art that various changes in form, details, and applications may be made therein. For example, other compact conductor shapes than the serpentine folds may be used, such as a folded back spiral. Also, different branch spacing could be used as long as the number and length of the serpentine folds is adjusted to provide the appropriate electrical length. It is accordingly intended that the appended claims shall cover all such changes in form, details and applications which do not depart from the true spirit and scope of the invention.

What is claimed as new and desired to be secured by Letters Patent of the United States is:

1. A high speed peripheral bus for a computer system, comprising:

a printed wiring board;

a printed wiring conductor located on a first surface of said board, said printed wiring conductor being a single line of said high speed peripheral bus;

a terminal of a first set of terminals connecting a first end of said printed wiring conductor to a high speed bus signal of said computer system;

a terminal of a second set of terminals connecting to a second end of said printed wiring conductor;

a terminal of a third set of terminals located between said terminal of said first set of terminals and said terminal of said second set of terminals connecting to said printed wiring conductor at a branch connection; and said printed wiring conductor being folded into a serpentine configuration between said terminal of said second set of terminals and a terminal of said third set of terminals to create a desired signal path length sufficient to reduce any reflection of said signal to a level that does not generate a false logic level.

2. The high speed peripheral bus for a computer system according to claim 1, further comprising:

a distance between said terminal of said second set of terminals and said terminal of said third set of terminals is at most 0.05 meters.

3. A high speed peripheral bus for a computer system according to claim 2, further comprising:

said path length of said signal between said terminal of said second set of terminals and said terminal of said third set of terminals is at least 0.3 meters.

4. A high speed peripheral bus for a computer system according to claim 1, further comprising:

said path length of said signal between said terminal of said second set of terminals and said terminal of said third set of terminals is at least 0.3 meters.

5. A high speed peripheral bus for a computer system according to claim 4, further comprising:

a ground conductor located on a second of said plurality of layers of said printed wiring board separated from said first layer by an insulating layer; and a characteristic impedance between said printed wiring conductor and said ground conductor is at least 90 ohms.

6. A high speed peripheral bus for a computer system according to claim 5, wherein said characteristic impedance is at the frequency of said signal.

7. A circuit apparatus to connect a plurality of signals of a high speed bus interface of a computer system, comprising:

a printed wiring board;

a first multiple conductor connector located on said printed wiring board for connecting to said plurality of signals of said high speed bus interface of said computer system;

a first plurality of terminals located on said printed wiring board for connecting to said plurality of signals of said high speed bus interface of said computer system via said connector;

a second multiple conductor connector mounted on said printed wiring board in a close spaced relationship to said first connector;

a second plurality of terminals each connected to a respective conductor of said second multiple conductor connector; and a plurality of printed wiring conductors equal in number to said number of said plurality of signals of said high speed bus interface, each of said printed wiring conductors is connected between a respective terminal of said first plurality of terminals and a respective terminal of said second plurality of terminals, each of said printed wiring conductors having a serpentine shape so as to create a signal path length sufficient to reduce any signal reflection to a level that does not generate a false logic level.

8. A circuit apparatus as set forth in claim 7, wherein:

each of said plurality of printed wiring conductors has a total length that is sufficient for any signal reflections caused by the connection to said second plurality of terminals to be reduced to an insignificant level.

9. A circuit apparatus as set forth in claim 8, wherein each of said plurality of printed wiring conductors has a total length of at least 0.3 meters.

10. A circuit apparatus as set forth in claim 9, wherein each of said plurality of printed wiring conductors has a characteristic impedance of at least 90 ohms.

11. A circuit apparatus as set forth in claim 10, wherein each of said plurality of printed wiring conductors has a total length of at least 0.3 meters folded in said serpentine shape within an area that is at most 0.05 meters in maximum extent.

12. A circuit apparatus as set forth in claim 11, wherein:

each of said conductors is 0.0001524 meters in width; and an edge of one fold each of said conductors is located 0.0004826 meters from a nearest edge of an adjacent fold of said serpentine shape.

13. A circuit apparatus as set forth in claim 7, wherein:

each of said conductors is spaced at least 0.005 meters from a nearest point of any other of said conductors.

14. A method of forming a high speed peripheral bus meeting SCSI standards for peripheral device spacing in a compact cabinet, the method comprising the steps of:

forming a printed wiring board having a plurality of signal lines comprising electrical conductors attached to a surface of the board;

defining a plurality of peripheral device connection terminals generally uniformly spaced along a length of each of the conductors; and folding each of the conductors between adjacent connection terminals into serpentine configurations such that the physical spacing between adjacent connections terminals is substantially less than the length of electrical conductor between the adjacent terminals and such that a signal path length sufficient to reduce any signal reflection to a level that does not generate a false logic level is created.

* * * * *